(12) United States Patent
Tobita

(10) Patent No.: US 6,930,529 B2
(45) Date of Patent: Aug. 16, 2005

(54) OFFSET COMPENSATION CIRCUIT COMPENSATING FOR OFFSET VOLTAGE OF DRIVE CIRCUIT AS WELL AS DRIVE CIRCUIT WITH OFFSET-COMPENSATION CAPABILITY AND LIQUID-CRYSTAL DISPLAY DEVICE USING THE OFFSET COMPENSATION CIRCUIT

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/806,376

(22) Filed: Mar. 23, 2004

(65) Prior Publication Data

US 2004/0189369 A1 Sep. 30, 2004

(30) Foreign Application Priority Data

Mar. 25, 2003 (JP) ...................................... 2003-082580
Jul. 7, 2003 (JP) ...................................... 2003-193015

(51) Int. Cl.$^7$ ............................................... H03I 5/00
(52) U.S. Cl. ...................................... 327/307; 327/554
(58) Field of Search ................................ 327/307, 337, 327/553, 554, 555

(56) References Cited

U.S. PATENT DOCUMENTS

| 4,644,304 A | * | 2/1987 | Temes ......................... 333/173 |
| 4,707,624 A | * | 11/1987 | Yee ............................. 327/362 |
| 4,942,367 A | * | 7/1990 | Milkovic ....................... 330/9 |
| 5,168,179 A | * | 12/1992 | Negahban-Hagh .......... 327/554 |
| 5,825,230 A | * | 10/1998 | Chen et al. .................. 327/337 |
| 6,104,235 A | * | 8/2000 | Monti et al. ................. 327/554 |
| 6,169,427 B1 | * | 1/2001 | Brandt ......................... 327/94 |
| 6,288,669 B1 | * | 9/2001 | Gata ........................... 341/172 |
| 6,339,363 B1 | * | 1/2002 | Fowler ....................... 330/308 |
| 6,459,078 B1 | * | 10/2002 | Fowler ................... 250/214 A |
| 6,509,791 B2 | * | 1/2003 | Segawa et al. ............. 327/554 |
| 6,639,414 B2 | * | 10/2003 | Lien ........................... 324/658 |
| 6,670,846 B2 | * | 12/2003 | Yamamoto et al. ......... 327/554 |

FOREIGN PATENT DOCUMENTS

| JP | 3-139908 | 6/1991 |
| JP | 2000-114889 | 4/2000 |
| JP | 2004-4241 | 1/2004 |

\* cited by examiner

*Primary Examiner*—Terry D. Cunningham
(74) *Attorney, Agent, or Firm*—Oblon, Spivak, McClelland, Maier & Neustadt, P.C.

(57) ABSTRACT

An offset-compensation drive circuit turns on first, second and third switches to charge a first capacitor to an offset voltage of a drive circuit, and thereafter turns off the first and second switches and turns on a fourth switch to charge a second capacitor to a first voltage loss caused by a parasitic capacitor of an input node of the drive circuit. Following this, the third and fourth switches are turned off and fifth and sixth switches are turned on. At this time as well, there occurs a second voltage loss due to the parasitic capacitor and thus an output voltage is equal to a difference between an input voltage and the second voltage loss. Supposing that the parasitic capacitor, the first capacitor and the second capacitor have the same capacitance value, the second voltage loss is one-sixth as large as the first voltage loss.

10 Claims, 14 Drawing Sheets

OFFSET COMPENSATION CIRCUIT COMPENSATING FOR OFFSET VOLTAGE OF DRIVE CIRCUIT AS WELL AS DRIVE CIRCUIT WITH OFFSET-COMPENSATION CAPABILITY AND LIQUID-CRYSTAL DISPLAY DEVICE USING THE OFFSET COMPENSATION CIRCUIT

BACKGROUND OF THE INVENTION

1. Field of the Invention

The present invention relates to an offset compensation circuit as well as a drive circuit with offset-compensation capability and a liquid-crystal display device that use the offset compensation circuit. In particular, the present invention relates to an offset compensation circuit compensating for an offset voltage of a drive circuit which outputs a potential according to an input potential as well as a drive circuit with offset-compensation capability and a liquid-crystal display device using the offset compensation circuit.

2. Description of the Background Art

An offset compensation circuit canceling an offset voltage of a drive circuit has been proposed. The offset compensation circuit charges a capacitor to the offset voltage and connects the capacitor to an input node of the drive circuit so as to compensate for the offset voltage (see for example Japanese Patent Laying-Open No. 2000-114889).

The conventional offset compensation circuit, however, encounters a problem that it cannot accurately compensate for the offset voltage since the voltage of the capacitor is lost due to the influence of a parasitic capacitor of the input node of the drive circuit.

Although the voltage loss could be reduced by making the capacitance value of the capacitor sufficiently greater than that of the parasitic capacitor, a resultant need for increase of the area of the capacitor causes the area occupied by the offset compensation circuit to expand. If the offset compensation circuit is employed for a data-line drive circuit of a liquid-crystal display device, many offset compensation circuits are necessary so that the problem would become particularly severe.

SUMMARY OF THE INVENTION

It is thus a chief object of the present invention to provide an offset compensation circuit capable of accurately canceling an offset voltage as well as a drive circuit with offset-compensation capability and a liquid-crystal display device that use the offset compensation circuit.

An offset compensation circuit according to the present invention compensates for an offset voltage of a drive circuit outputting a potential according to an input potential, and includes: first to N-th capacitors where N is an integer of at least two, the capacitors each having one electrode and the other electrode, the first capacitor having one electrode connected to an input node of the drive circuit, and second to N-th capacitors each having one electrode connected to the other electrode of a preceding capacitor; a first switch circuit supplying a predetermined potential to the input node of the drive circuit and connecting the other electrode of the first capacitor to an output node of the drive circuit to charge the first capacitor to the offset voltage; a second switch circuit successively selecting the second to N-th capacitors each for a predetermined period of time, supplying the input potential to one electrode of a selected capacitor and connecting the other electrode of the selected capacitor to the output node of the drive circuit to charge the first to N-th capacitors to the offset voltage; and a third switch circuit supplying the input potential to the other electrode of the N-th capacitor. Accordingly, the influence of the parasitic capacitor of the input node of the drive circuit can be reduced and thus the offset voltage can accurately be cancelled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
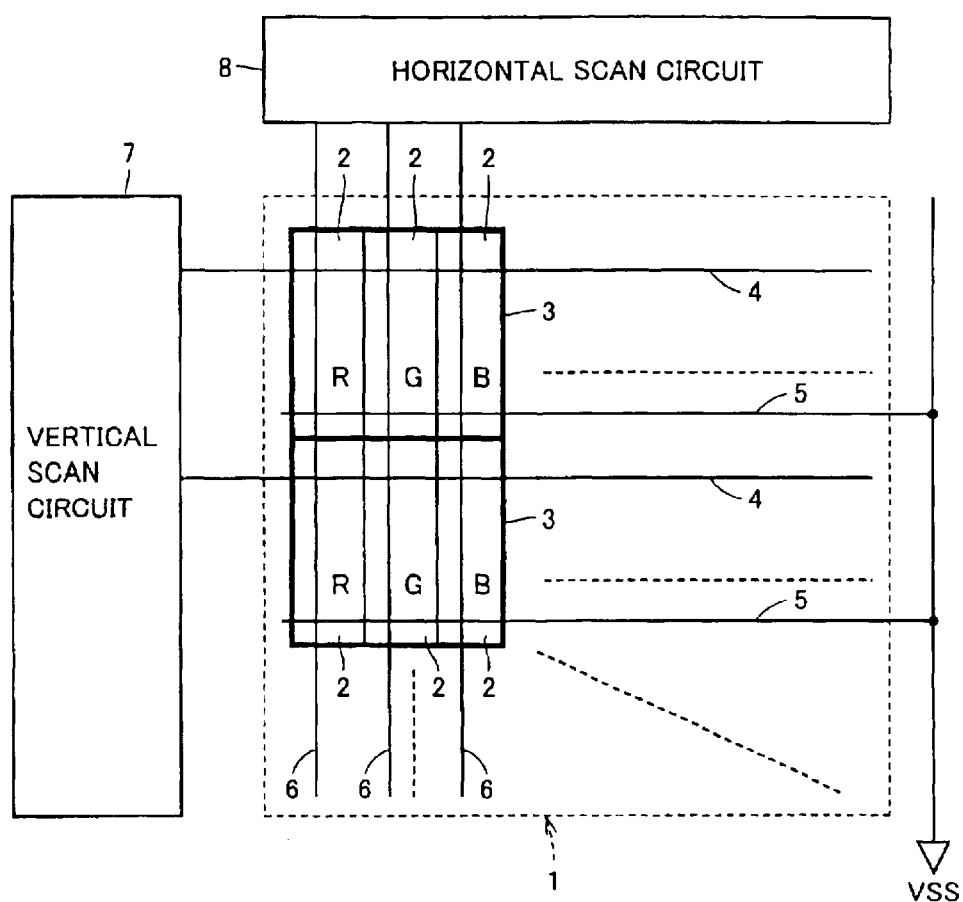
FIG. 1 is a block diagram showing an entire configuration of a color liquid-crystal display device according to a first embodiment of the present invention.

FIG. 1 is a block diagram showing a configuration of a color liquid-crystal display device according to a first embodiment of the present invention. Referring to FIG. 1, this color liquid-crystal display device includes a liquid-crystal panel 1, a vertical scan circuit 7 and a horizontal scan circuit 8, and may be provided for example in a mobile phone.

Liquid-crystal panel 1 includes a plurality of liquid-crystal cells 2 arranged in rows and columns, scan lines 4 and common potential lines 5 provided correspondingly to respective rows, and data lines 6 provided correspondingly to respective columns.

In each row, liquid-crystal cells 2 are divided in advance into groups each containing three cells. Three liquid-crystal cells 2 in each group are provided with R, G and B color filters respectively. Three liquid-crystal cells 2 in each group constitute one pixel 3.

Figure 2:
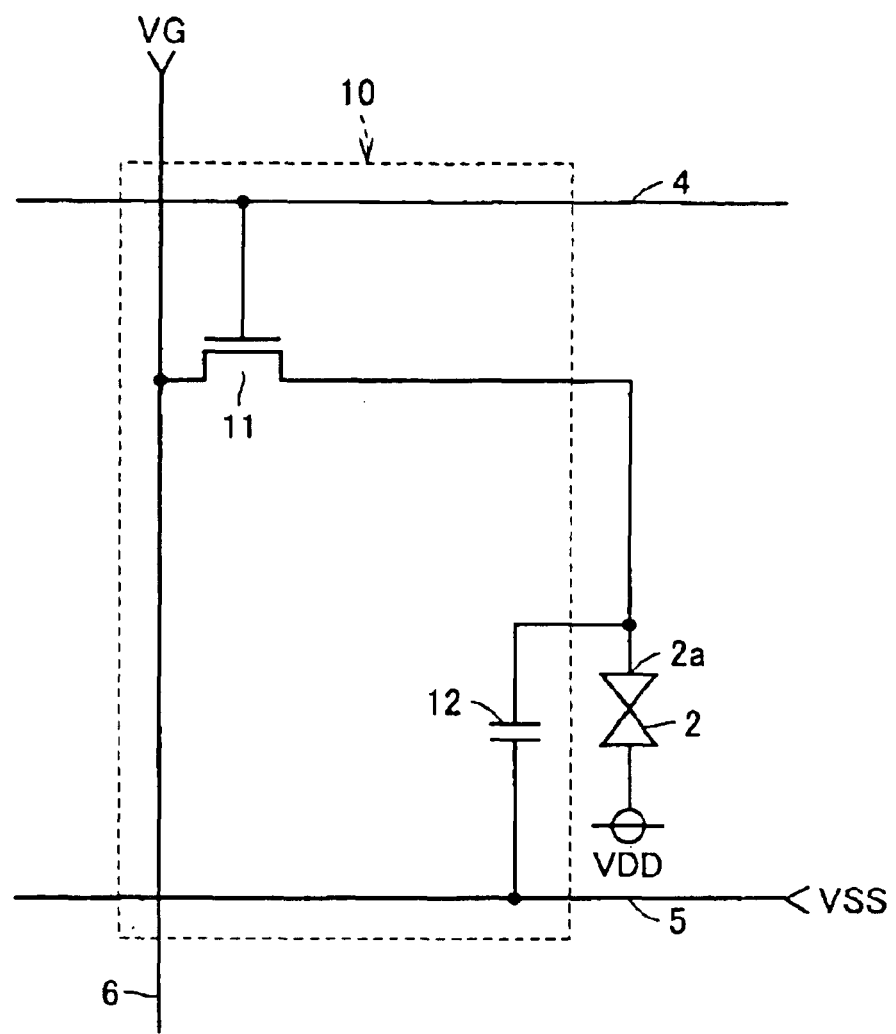
FIG. 2 is a circuit diagram showing a configuration of a liquid-crystal drive circuit provided correspondingly to each of liquid-crystal cells shown in FIG. 1.

Liquid-crystal cells 2 are each provided with a liquid-crystal drive circuit 10 as shown in FIG. 2. Liquid-crystal drive circuit 10 includes an n-type transistor 11 and a capacitor 12. N-type transistor 11 is connected between data line 6 and one electrode 2a of liquid-crystal cell 2 and has its gate connected to scan line 4. Capacitor 12 is connected between one electrode 2a of liquid-crystal cell 2 and common potential line 5. To the other electrode of liquid-crystal cell 2, a drive potential VDD is supplied and a common potential VSS is supplied to common potential line 5.

Referring again to FIG. 1, according to an image signal, vertical scan circuit 7 successively selects a plurality of scan lines 4 one by one each for a predetermined period of time and causes a selected scan line 4 to reach "H" level which is the selection level. When scan line 4 is set to the selection level of "H" level, n-type transistor 11 shown in FIG. 2 is turned on so that one electrode 2a of each liquid-crystal cell 2 corresponding to this scan line 4 is connected with data line 6 corresponding to this liquid-crystal cell 2.

According to an image signal, horizontal scan circuit 8 supplies a gray-level potential VG to each data line 6 in the period in which one scan line 4 is selected by vertical scan circuit 7. The light transmittance of liquid-crystal cell 2 changes according to the level of gray-level voltage VG. When all liquid-crystal cells 2 of liquid-crystal panel 1 have been scanned by vertical scan circuit 7 and horizontal scan circuit 8, an image is displayed on liquid-crystal panel 1.

Figure 3:
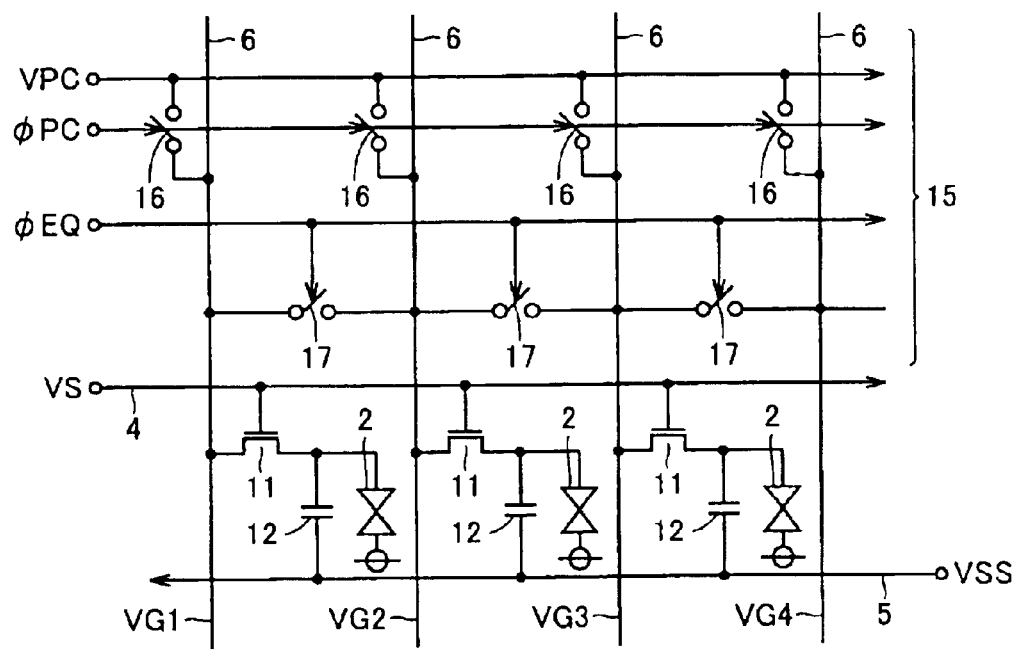
FIG. 3 is a circuit diagram showing a configuration of an equalizer-and-precharge circuit included in a horizontal scan circuit shown in FIG. 1.

FIG. 3 is a circuit diagram showing a main part of horizontal scan circuit 8 in FIG. 1. Referring to FIG. 3, horizontal scan circuit 8 includes an equalizer-and-precharge circuit 15 for setting the potential on each data line 6 to a precharge potential VPC before gray-level potential VG is supplied to each data line 6.

Equalizer-and-precharge circuit 15 includes switches 16 provided correspondingly to respective data lines 6 and switches 17 each provided correspondingly to two data lines 6 adjacent to each other. One terminal of switch 16 receives precharge potential VPC while the other terminal thereof is connected to its corresponding data line 6. Switch 16 is turned on when a precharge signal φPC is set to "H" level which is the activation level. When switch 16 is turned on, each data line 6 is set to precharge potential VPC. Switch 17 is connected between two data lines 6 and is turned on when an equalize signal φEQ is set to "H" level which is the activation level. When switch 17 is turned on, respective potentials on all data lines 6 are averaged. After switches 16 and 17 are turned off, gray-level potential VG is supplied to each data line 6. It is supposed here that precharge potential VCP is 0 V.

Figure 4:
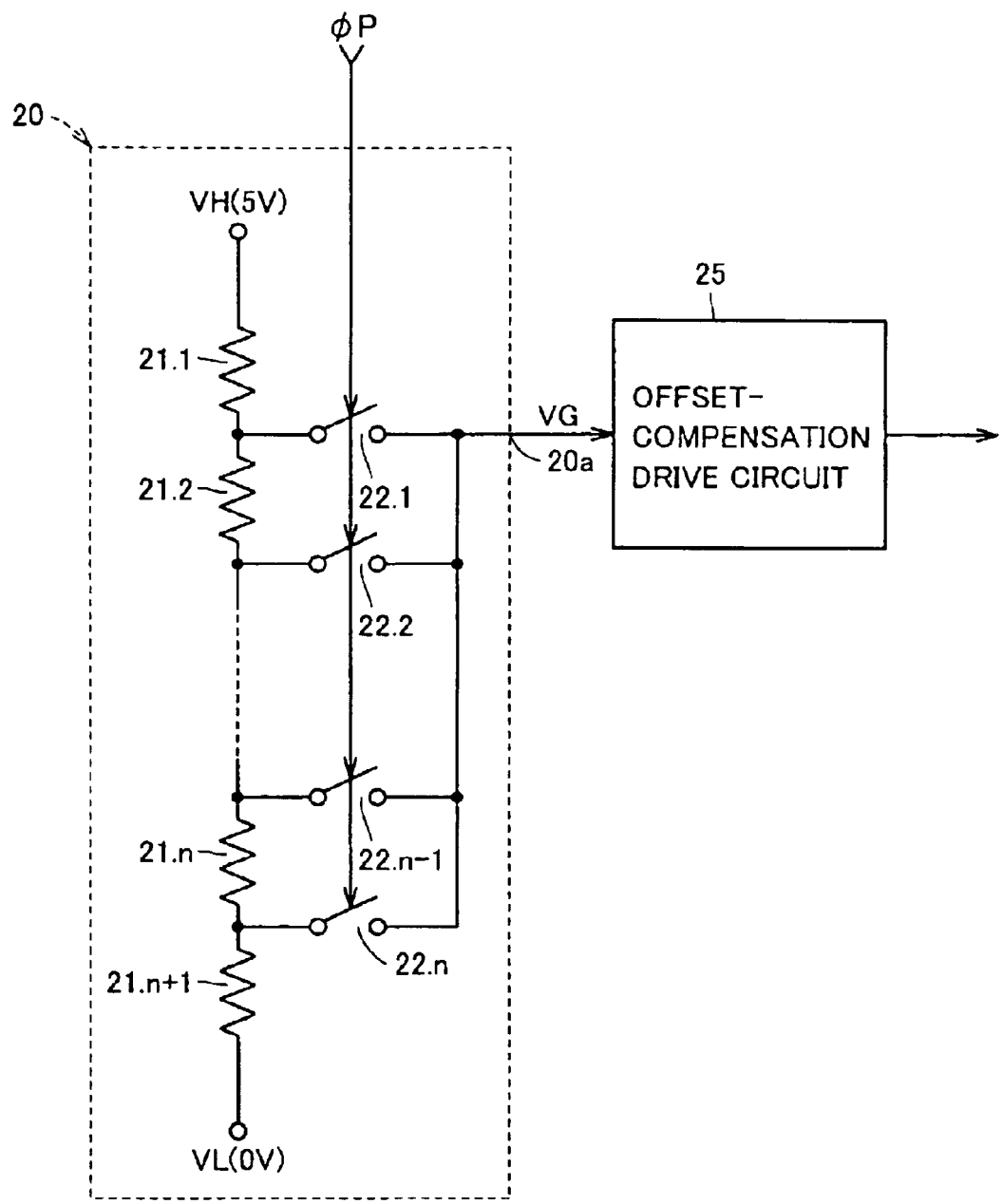
FIG. 4 is a circuit block diagram showing a configuration of a gray-level potential generation circuit and an offset-compensation drive circuit included in the horizontal scan circuit in FIG. 1.

FIG. 4 shows a gray-level potential generation circuit 20 for supplying gray-level potential VG to data line 6 and a drive circuit 25 having offset-compensation capability (hereinafter such a drive circuit is referred to as "offset-compensation drive circuit"). The number of gray-level potential generation circuits 20 and that of offset-compensation drive circuits 25 are each equal to the number of data lines 6.

Gray-level potential generation circuit 20 includes n+1 (n is a natural number) resistance elements 21.1–21.n+1 connected in series between a line of a first power-supply potential VH (5 V) and a line of a second power-supply potential VL (0 V), and n switches 22.1–22.n connected between respective n nodes between n+1 resistance elements 21.1–21.n+1 and an output node 20a.

On the n nodes between n+1 resistance elements 21.1–21.n+1, potentials of n levels appear respectively. Switches 22.1–22.n are controlled by an image node signal φP and only one of the switches is turned on. To output node 20a, one of respective potentials of the n levels is output as gray-level potential VG. Offset-compensation drive circuit 25 supplies electric current to data line 6 so that selected data line 6 is set to gray-level potential VG.

Figure 5:
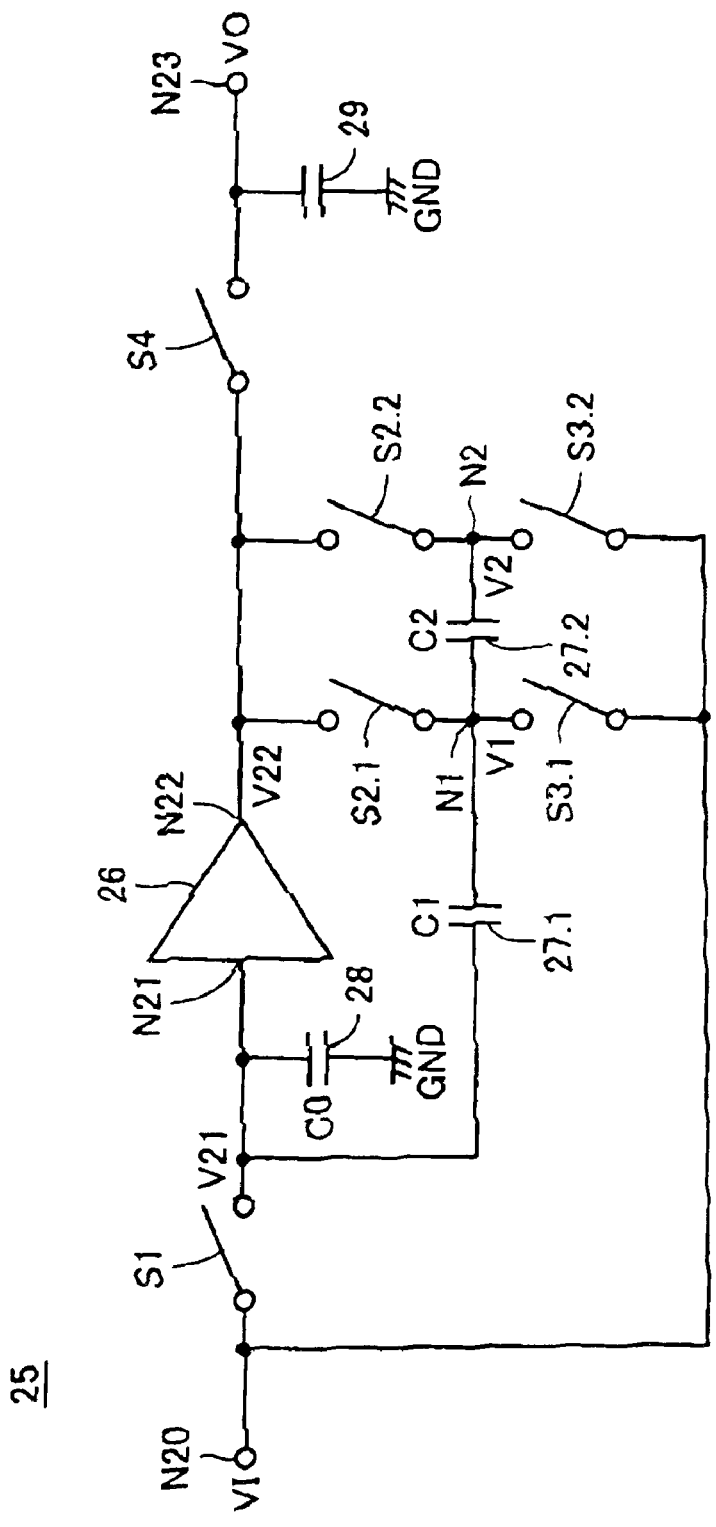
FIG. 5 is a circuit diagram showing a configuration of the offset-compensation drive circuit shown in FIG. 4.

FIG. 5 is a circuit diagram showing a configuration of offset-compensation drive circuit 25. Referring to FIG. 5, offset-compensation drive circuit 25 includes a push-type drive circuit 26, capacitors 27.1 and 27.2 and switches S1, S2.1, S2.2, S3.1, S3.2 and S4. Precharge potential VCP is 0 V and gray-level potential VG ranges from 0 V to 5 V. Then, data line 6 may be charged and no discharging is necessary. Accordingly, for this color liquid-crystal display device, drive circuit 26 of the push-type is employed.

Figure 6:
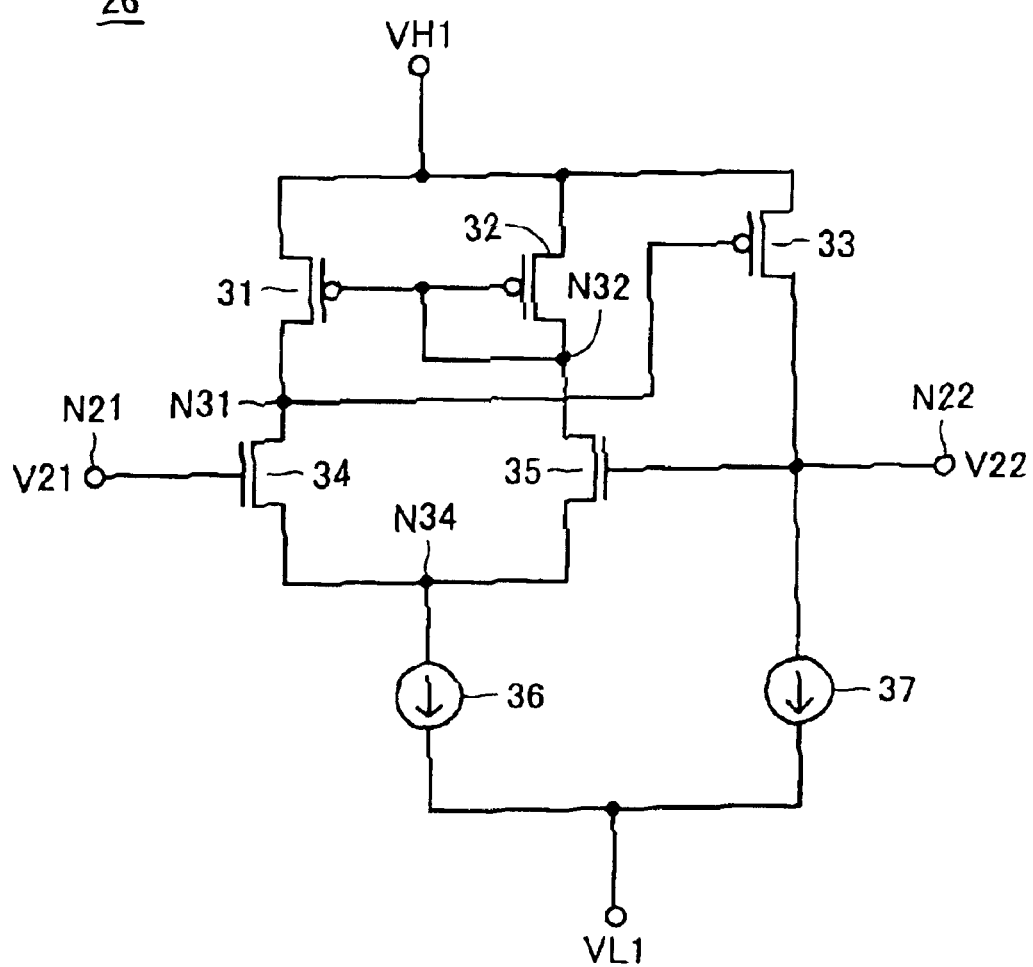
FIG. 6 is a circuit diagram showing a configuration of a push-type drive circuit shown in FIG. 5.

Referring to FIG. 6, push-type drive circuit 26 includes p-type transistors 31–33, n-type transistors 34 and 35 and constant-current sources 36 and 37. P-type transistors 31 and 32 are connected between a line of a third power-supply potential VH1 (10 V for example) and nodes N31 and N32 respectively and have respective gates both connected to node N32. P-type transistors 31 and 32 constitute a current-mirror circuit.

N-type transistors 34 and 35 are connected respectively between nodes N31 and N32 and a node N34 and have respective gates connected to an input node N21 and an output node N22. Constant-current source 36 flows a predetermined constant-current from output node N34 to a line of a fourth power-supply potential VL1 (0 V for example). P-type transistor 33 is connected between the line of the third power-supply potential VH1 and output node N22 and has its gate connected to node N31. Constant-current source 37 flows a predetermined constant-current from output node N22 to the line of the fourth power-supply potential VL1. P-type transistors 31 and 32, N-type transistors 34 and 35 and constant-current source 36 constitute a differential amplifier circuit.

To n-type transistor 34, a current of a level according to a potential V21 on input node N21 flows. To n-type transistor 35, a current of a level according to a potential V22 on output node N22 flows. P-type transistors 31 and 32 constitute a current-mirror circuit and p-type transistor 32 and n-type transistor 35 are connected in series. Then, to transistors 31, 32 and 35, a current of a level according to potential V22 on output node N22 flows.

If potential V21 is higher than potential V22, the current flowing to p-type transistor 31 is smaller than the current flowing to n-type transistor 34 and the potential on node N31 decreases while the current flowing to p-type transistor 33 increases so that potential V22 increases. If potential V21 is lower than potential V22, the current flowing to p-type transistor 31 is greater than the current flowing to n-type transistor 34 and the potential on node N31 increases while the current flowing to p-type transistor 33 decreases so that potential V22 decreases. As a result, potential V21 becomes equal to potential V22 (V21=V22).

In other words, push-type drive circuit 26 is a buffer circuit having a high input impedance and a low output impedance with a voltage amplification factor of 1. Due to differences between threshold voltages of transistors 31–35, however, a potential difference between input potential V21 and output potential V22 is caused, namely there arises an offset voltage VOF therebetween. For example, if n-type transistors 34 and 35 have different threshold voltages VTN, offset voltage VOF is caused. This offset voltage VOF is represented as a difference between respective threshold voltages of n-type transistors 34 and 35, i.e., |ΔVTN|.

Referring again to FIG. 5, input node N21 of push-type drive circuit 26 has a parasitic capacitor C0. In FIG. 5, parasitic capacitor C0 is shown as a capacitor 28 connected between input node N21 and a line of a ground potential GND. A load capacitor is shown as a capacitor 29 connected between an output node N23 and the line of ground potential GND. Capacitors 27.1 and 27.2 and switches S1, S2.1, S2.2, S3.1, S3.2 and S4 constitute an offset compensation circuit for compensating for offset voltage VOF of push-type drive circuit 26.

Specifically, switch S1 is connected between input node N20 and input node N21 of drive circuit 26 and switch S4 is connected between output node N23 and output node N22 of drive circuit 26. Capacitor 27.1 and switch S2.1 are connected in series between input node N21 and output node N22 of drive circuit 26. Switch S3.1 is connected between input node N20 and node N1 between capacitor 27.1 and switch S2.1. Capacitor 27.2 and switch S2.2 are connected in series between nodes N1 and N22. Switch S3.2 is connected between input node N20 and a node N2 between capacitor 27.2 and switch S2.2.

Switches S1, S2.1, S2.2, S3.1, S3.2 and S4 each may be a p-type transistor, n-type transistor or a combination of a p-type transistor and an n-type transistor connected in parallel. ON/OFF of switches S1, S2.1, S2.2, S3.1, S3.2 and S4 each is controlled by a control signal (not shown).

Figure 7:
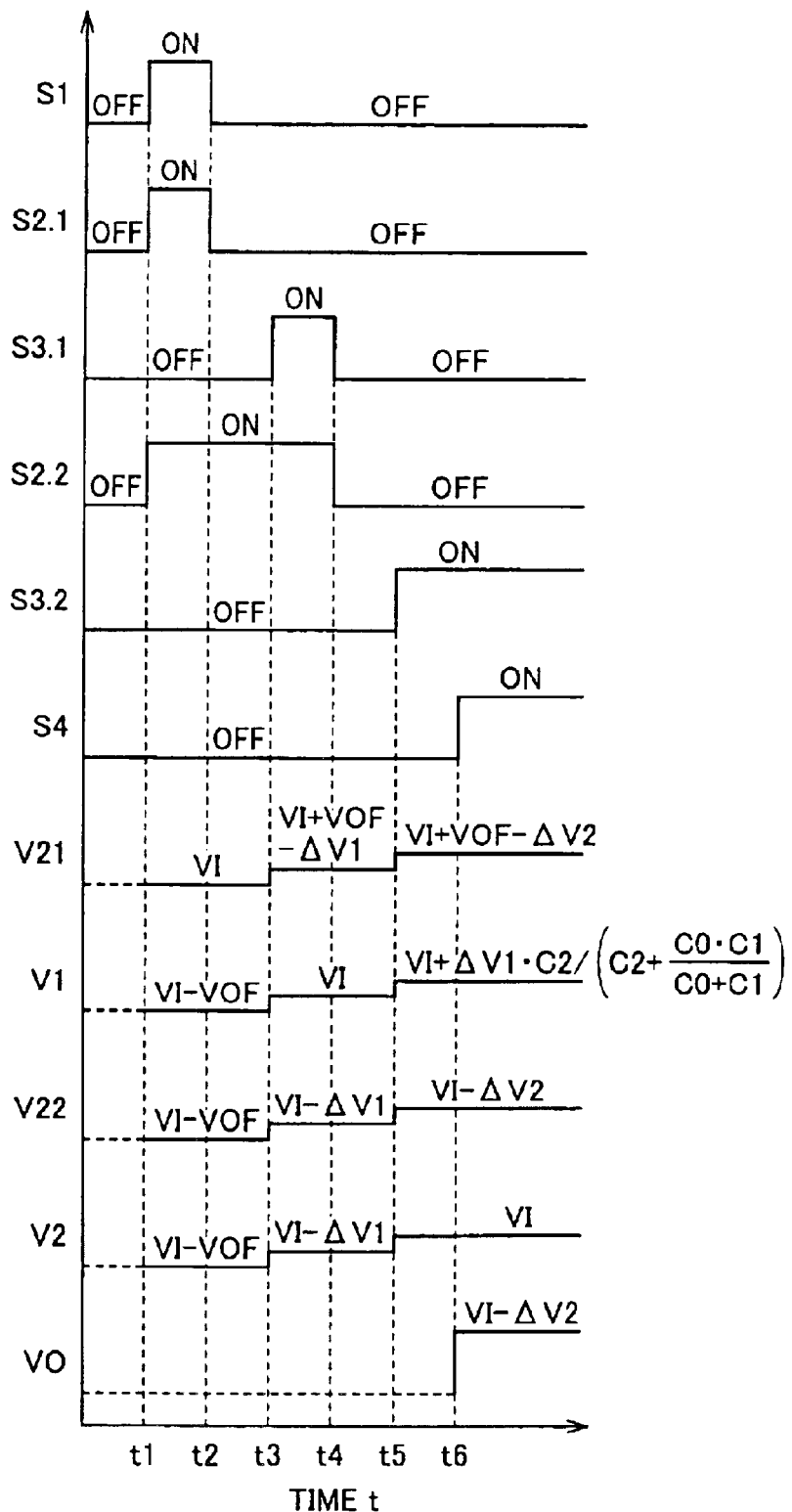
FIG. 7 is a timing chart showing an operation of the offset-compensation drive circuit shown in FIG. 5.

A description is now given below concerning a state that output potential V22 of drive circuit 26 is lower by offset voltage VOF than input potential V21. As shown in FIG. 7, in an initial state, all of switches S1, S2.1, S2.2, S3.1, S3.2 and S4 are in an off state. At a certain time t1, switches S1, S2.1 and S2.2 are turned on so that potential V21 on input node N21 of drive circuit 26 is equal to VI (V21=VI) and output potential V22 of drive circuit 26 and respective potentials V1 and V2 on nodes N1 and N2 have a relation: V22=V1=V2=VI−VOF. Then, capacitor 27.1 is charged to offset voltage VOF and the voltage between the terminals of capacitor 27.2 is reset to 0 V.

At time t2, switches S1 and S2.1 are turned off so that offset voltage VOF is held in capacitor 27.1. Then, at time t3, switch S3.1 is turned on so that potential V1 on node N1 becomes equal to VI (V1=VI). If input node N21 of drive circuit 26 has no parasitic capacitor C0, input potential V21 of drive circuit 26 is equal to VI+VOF (V21=VI+VOF) and output potential V22 of drive circuit 26 is equal to VI (V22=VI). Actually, however, because of the presence of parasitic capacitor C0, input potential V21 of drive circuit 26 is represented by an equation: V21=VI+VOF−ΔV1 and output potential V22 of drive circuit 26 is represented by an equation: V22=VI−ΔV1. This voltage loss ΔV1 is represented by the following equation where C1 indicates the capacitance of capacitor 27.1:

$$\Delta V1 = VOF \circ C0/(C0+C1) \quad (1).$$

At this time, switches S2.2 and S3.1 are turned on and switch S3.2 is turned off so that potential V2 on node N2 is represented by an equation: V2=VI−ΔV1. In other words, potential V2 on node N2 is lower than input potential VI by voltage loss ΔV1 caused by the first offset cancel operation and accordingly capacitor 27.2 is charged to ΔV1.

At time t4, switches S2.2 and S3.1 are turned off and thereafter switch S3.2 is turned on at time t5. Then, potential V2 on node N2 changes from VI−ΔV1 to VI. Namely, potential V2 on node N2 increases by ΔV1. This amount of potential change ΔV1 is transmitted to node N21 via capacitors 27.2 and 27.1 to cause potential V21 on node N21 to increase. In this case as well, a voltage loss ΔV2 occurs due to parasitic capacitor C0 and potential V21 on node N21 increases by ΔV1−ΔV2 and thus is represented by an equation: V21=VI+VOF−ΔV1+ΔV1−ΔV2=VI+VOF−ΔV2.

The increase of potential V1 on node N21 then causes potential V22 on node N22 to increase by the same voltage ΔV1−ΔV2 and potential V22 is thus represented by an equation: V22=VI−ΔV1+ΔV1−ΔV2=VI−V2. Potential V1 on node N1 is represented by the following equation (2) where C1 and C2 represent respective capacitances of capacitors 27.1 and 27.2:

$$V1 = VI + \Delta V1 \circ C2/[C2 + C0 \circ C1/(C0+C1)] \quad (2).$$

Further, ΔV2 is represented by the following equation (3):

$$\Delta V2 = \Delta V1 \circ C0/[C0 + C1 \circ C2/(C1+C2)] \quad (3).$$

For the purpose of simplifying description, it is supposed that C1 equals to C2 (C1=C2). Then, a relation ΔV2=ΔV1 C0/(C0+C1/2) is established. Moreover, supposing that C0/C1 is ⅒ (C0/C1=⅒), ΔV2 is represented by an equation: ΔV2=ΔV1·⅙. In other words, voltage loss ΔV2 caused by the second offset cancel operation is reduced to one-sixth of the first voltage loss ΔV1.

The conventional method using one capacitor per offset-cancel operation so as to reduce loss ΔV1 to one-sixth requires a capacitor of the sixfold area. According to the first embodiment, two capacitors 27.1 and 27.2 are used and thus the capacitor area is doubled. However, the capacitor area required for reducing loss ΔV1 to one-sixth is two-sixths, namely one-third as large as the conventional one. It is noted that the area of switches S2.2 and S3.2 each is sufficiently smaller than that of the capacitors.

At time t6, switch S4 is turned on so that output potential VO becomes equal to VI−ΔV2 and is supplied to a load. Switch S4 is not an inevitable element here. If switch S4 is not provided and the load is large, however, a longer time is taken for stabilizing the voltage VOF between the terminals of capacitor 27.1 from time t1 at which switches S1, S2.1 and S2.2 are turned on.

Figure 8:
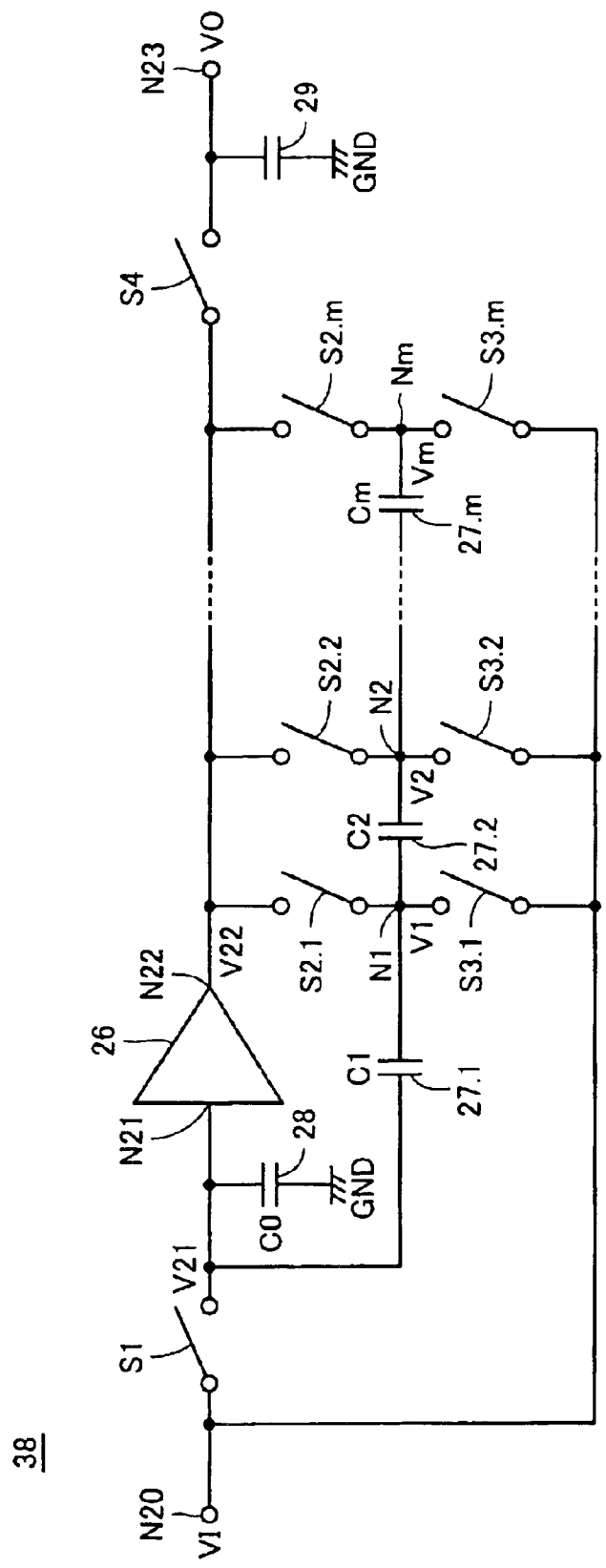
FIG. 8 is a circuit diagram showing a modification of the first embodiment.

FIG. 8 is a circuit diagram showing a configuration of an offset-compensation drive circuit 38 according to a modification of the first embodiment. Referring to FIG. 8, offset-compensation drive circuit 38 differs from offset-compensation drive circuit 25 in FIG. 5 in that the former includes m (m is an integer of at least 3) capacitors 27.1–27.m, m switches S2.1–S2.m and m switches S3.1–S3.m instead of two capacitors 27.1 and 27.2, two switches S2.1 and S2.2 and two switches S3.1 and S3.2.

One electrode of capacitor 27.1 is connected to the input node of drive circuit 26 and one electrode of capacitors 27.2–27.m each is connected to the other electrode of corresponding one of capacitors 27.1–27.m–1. One terminal of switches S2.1–S2.m each is commonly connected to node N22 and the other terminal thereof is connected to the other electrode of corresponding one of capacitors 27.1–27.m. One terminal of switches S3.1–S3.m each is commonly connected to node N20 and the other terminal thereof is connected to the other electrode of corresponding one of capacitors 27.1–27.m.

At a certain time, switches S1 and S2.1–S2.m are turned on so that capacitor 27.1 is charged to offset voltage VOF and the voltage between the terminals of capacitors 27.1–27.m each is reset to 0 V.

After switches S1 and S2.1 are turned off, switch S3.1 is turned on so that capacitor 27.2 is charged to the first voltage loss ΔV1. Then, switch S2.2 is turned off and switch S3.2 is turned on so that capacitor 27.3 is charged to the second voltage loss ΔV2. In the same manner, capacitor 27.m is charged to a (m−1)-th voltage loss ΔVm−1. Following this, switch S2.m is turned off and switch S3.m is turned on.

Supposing that C1 represents the capacitance of capacitors 27.1–27.m each, voltage loss ΔVm when the offset cancel operation is done m times is represented by the following equation (4):

$$\Delta Vm = VOF \circ C0/(C0+C1) \circ C0/(C0+C1/2) \ldots C0/(C0+C1/m) \quad (4)$$

While voltage loss ΔVm decreases as m is increased, the degree of reduction accordingly decreases and the adverse influence of the increased area of capacitors 27.1–27.m relatively increases. Then, it should be noted that an optimum number of times m has to be determined according to a required precision of an output potential.

Second Embodiment

Figure 9:
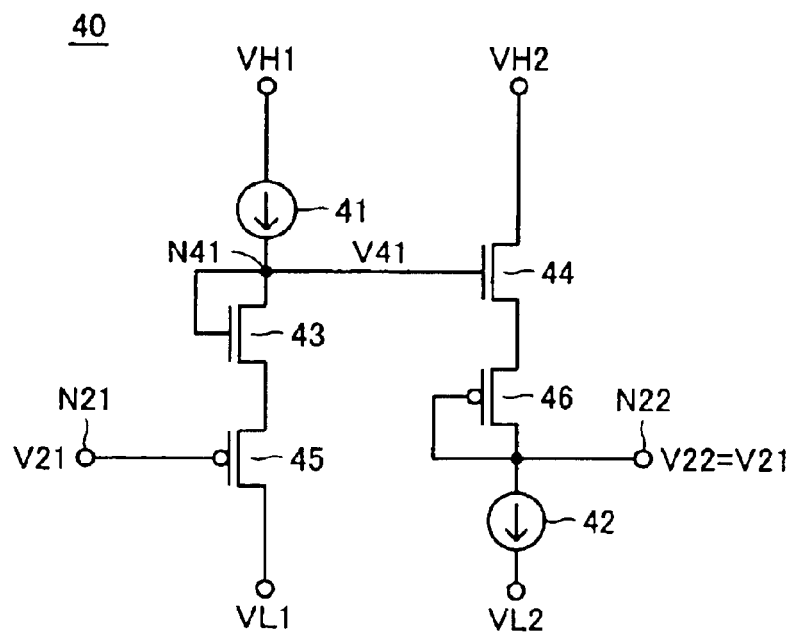
FIG. 9 is a circuit diagram showing a configuration of a push-type drive circuit included in an offset-compensation drive circuit according to a second embodiment of the present invention.

FIG. 9 is a circuit diagram showing a main part of an offset-compensation drive circuit according to a second embodiment of the present invention. Referring to FIG. 9, this offset-compensation drive circuit differs from offset-compensation drive circuit 25 in FIG. 5 in that the former includes a push-type drive circuit 40 instead of push-type drive circuit 26.

Push-type drive circuit 40 includes constant-current sources 41 and 42, n-type transistors 43 and 44 and p-type transistors 45 and 46. Constant-current source 41, n-type transistor 43 and p-type transistor 45 are connected in series between a line of a third power-supply potential VH1 (10 V for example) and a line of a fourth power-supply potential VL1 (0 V for example). The gate of p-type transistor 45 is connected to input node N21. The gate of n-type transistor 43 is connected to its drain (node N41). Thus, n-type transistor 43 forms a diode. Since respective drive currents of transistors 43 and 45 are set sufficiently greater than a current value of constant-current source 41, p-type transistor 45 performs a source-follower operation and node N41 has a potential V41 represented by an equation: $V41 = V21 + |VTP| + VTN$, where VTP represents a threshold voltage of a p-type transistor and VTN represents a threshold voltage of an n-type transistor.

N-type transistor 44, p-type transistor 46 and constant-current source 42 are connected in series between a line of a fifth power-supply potential VH2 (10 V for example) and a line of a sixth power-supply potential VL2 (0 V for example). The gate of n-type transistor 44 receives potential V41 on node N41. The gate of p-type transistor 46 is connected to its drain (output node N22). Since respective drive currents of transistors 44 and 46 are set sufficiently greater than a current value of constant-current source 42, n-type transistor 44 performs a source-follower operation and output node N22 has its potential V22 represented by an equation: $V22 = V41 - VTN - |VTP| = V21$.

In other words, this push-type drive circuit 40 is a circuit having two-stage level-shift circuits connected to each other, one level-shift circuit including constant-current source 41, n-type transistor 43 and p-type transistor 45 while the other level-shift circuit including n-type transistor 44, p-type transistor 46 and constant-current source 42. Drive circuit 40 operates to charge via transistors 44 and 46 a node pre-charged in advance to a low potential so as to increase potential V22 on output node N22 to potential V21 on input node N21.

If n-type transistors 43 and 44 have the same threshold voltage VTN and p-type transistors 45 and 46 have the same threshold voltage VTP, drive circuit 40 does not have offset voltage VOF. If, however, there is a difference between respective threshold voltages VTN of n-type transistors 43 and 44 and/or there is a difference between respective threshold voltages VTP of p-type transistors 45 and 46, offset voltage VOF is generated. In this case, supposing that ΔVTN represents the difference between threshold voltages VTN of n-type transistors 43 and 44 and ΔVTP represents the difference between threshold voltages VTP of p-type transistors 45 and 46, offset voltage VOF is represented by an equation: $VOF = |\Delta VTP + \Delta VTN|$. This offset voltage VOF is reduced by the above-described offset cancel operation performed multiple times.

As compared with the first embodiment, the second embodiment has a smaller through current of the drive circuit and thus reduces the power consumption.

Modifications of the second embodiment are described now. A push-type drive circuit 47 in FIG. 10 differs from push-type drive circuit 40 in FIG. 9 in that the former does not include n-type transistor 43 and p-type transistor 46. Node N41 has potential V41 represented by an equation: $V41 = V21 + |VTP|$ and output voltage V22 is represented by an equation: $V22 = V41 - VTN = V21 + |VTP| - VTN$. Therefore, drive circuit 47 has offset voltage VOF equal to $VTN - |VTP|$ in the initial state. This offset voltage VOF is reduced by the above-described offset cancel operation performed multiple times.

Figure 10:
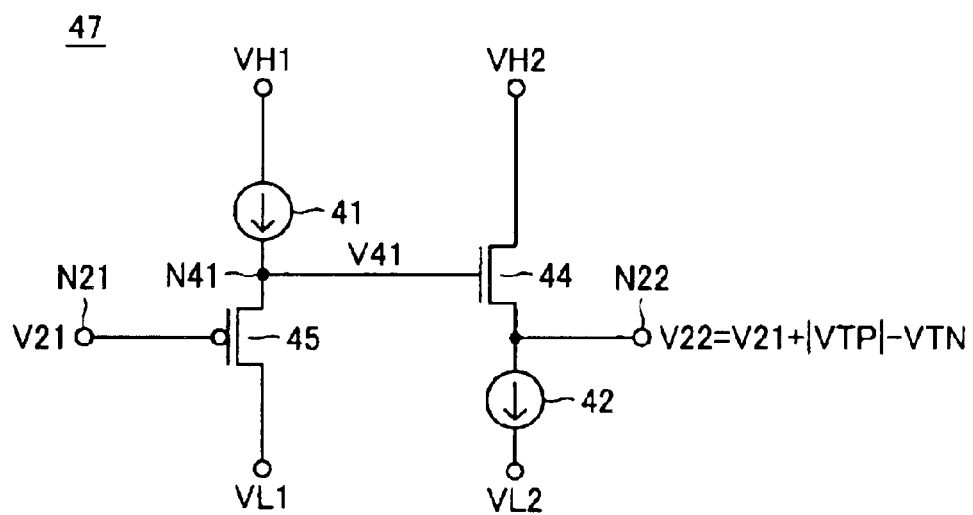
FIG. 10 is a circuit diagram showing a modification of the second embodiment.
Figure 11:
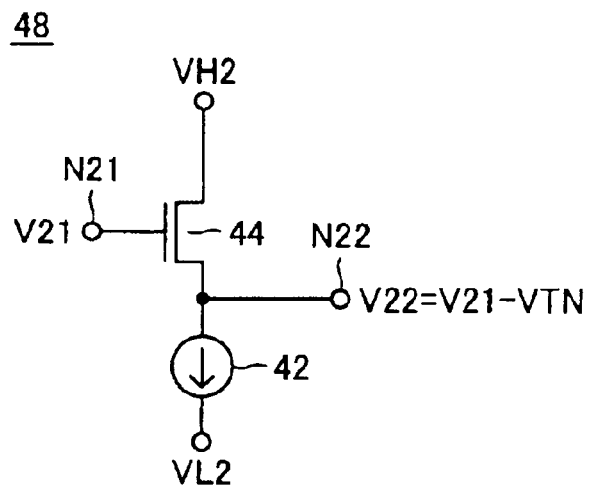
FIG. 11 is a circuit diagram showing another modification of the second embodiment.

A push-type drive circuit 48 shown in FIG. 11 differs from push-type drive circuit 47 in FIG. 10 in that the former does not include constant-current source 41 and p-type transistor 45 and the gate of n-type transistor 44 is connected to input node N21. Output potential V22 is then equal to V21−VTN. This drive circuit 48 thus has offset voltage VOF equal to VTN in the initial stage. This offset voltage VOF is reduced by the above-described offset cancel operation performed multiple times.

Third Embodiment

Figure 12:
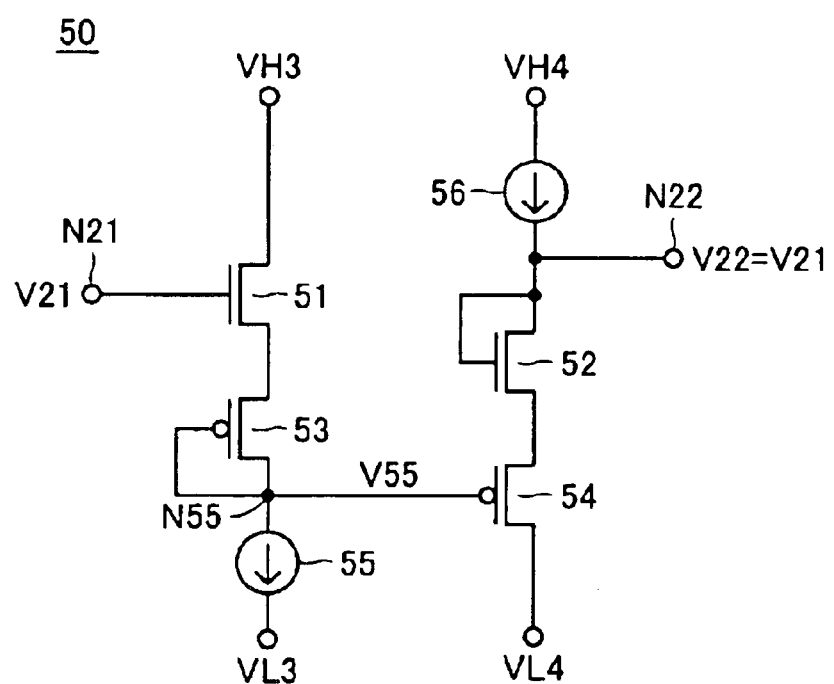
FIG. 12 is a circuit diagram showing an offset-compensation drive circuit according to a third embodiment of the present invention.

FIG. 12 is a circuit diagram showing a main part of an offset-compensation drive circuit according to a third embodiment of the present invention. Referring to FIG. 12, this offset-compensation drive circuit differs from offset-compensation drive circuit 25 in FIG. 5 in that the former includes a pull-type drive circuit 50 instead of push-type drive circuit 26. If precharge potential VCP described in connection with FIG. 3 is 5 V, gray-level potential VG ranges from 0 V to 5 V. Then, data lines 6 may be discharged and no charging is necessary. Accordingly, pull-type drive circuit 50 is used.

This pull-type drive circuit 50 includes n-type transistors 51 and 52, p-type transistors 53 and 54 and constant-current sources 55 and 56. N-type transistor 51, p-type transistor 53 and constant current source 55 are connected in series between a line of a seventh power-supply potential VH3 (5

V for example) and a line of an eighth power-supply potential VL3 (−10 V for example). N-type transistor 51 has its gate connected to input node N21. P-type transistor 53 has its gate connected to its drain (node N55). P-type transistor 53 thus forms a diode. Since respective drive currents of transistors 51 and 53 are set sufficiently greater than a current value of constant-current source 55, n-type transistor 51 performs a source-follower operation and node N55 has its potential V55 represented by an equation: V55=V21−VTN−|VTP|.

Constant-current source 56, n-type transistor 52 and p-type transistor 54 are connected in series between a line of a ninth power-supply potential VH4 (5 V for example) and a line of a tenth power-supply potential VL4 (−10 V for example). The gate of p-type transistor 54 is connected to node N55. The gate of n-type transistor 52 is connected to its drain (output node N22). Since respective drive currents of transistors 52 and 54 are set sufficiently greater than a current value of constant-current source 56, p-type transistor 54 performs a source-follower operation and potential V22 on output node N22 is represented by an equation: V22=V55+|VTP|+VTN=V21.

In other words, this pull-type drive circuit 50 corresponds to two-stage level-shift circuits connected to each other, one level-shift circuit including n-type transistor 51, p-type transistor 53 and constant-current source 55 and the other level-shift circuit including constant-current source 56, n-type transistor 52 and p-type transistor 54. Drive circuit 50 operates to discharge, via transistors 52 and 54, a node which is precharged to a high potential in advance and decrease potential V22 on output node N22 to potential V21 on input node N21.

If n-type transistors 51 and 52 have the same threshold voltage VTN and p-type transistors 53 and 54 have the same threshold voltage VTP, this drive circuit 50 has no offset voltage VOF. If, however, n-type transistors 51 and 52 have respective threshold voltages VTN different from each other and/or p-type transistors 53 and 54 have respective threshold-voltages VTP different from each other, offset voltage VOF is generated. In this case, supposing that ΔVTN represents the difference between respective threshold voltages VTN of n-type transistors 51 and 52 and ΔVTP represents the difference between respective threshold voltages VTP of p-type transistors 53 and 54, offset voltage VOF is represented by an equation: VOF=|ΔVTP+ΔVTN|. This offset voltage VOF is reduced by the above-described offset cancel operation performed multiple times.

According to the third embodiment as well, the drive circuit has a smaller through current as compared with that of the first embodiment and the power consumption is accordingly reduced.

Modifications of the third embodiment are described below. A pull-type drive circuit 57 shown in FIG. 13 differs from pull-type drive circuit 50 in FIG. 12 in that the former does not have p-type transistor 53 and n-type transistor 52. Node N55 has its potential V55 equal to V21−VTN so that output potential V22 is represented by an equation: V22=V21−VTN+|VTP|. Thus, drive circuit 57 has offset voltage VOF equal to VTN+|VTP| in an initial state. This offset voltage VOF is reduced by the above-described offset cancel operation performed multiple times.

Figure 13:
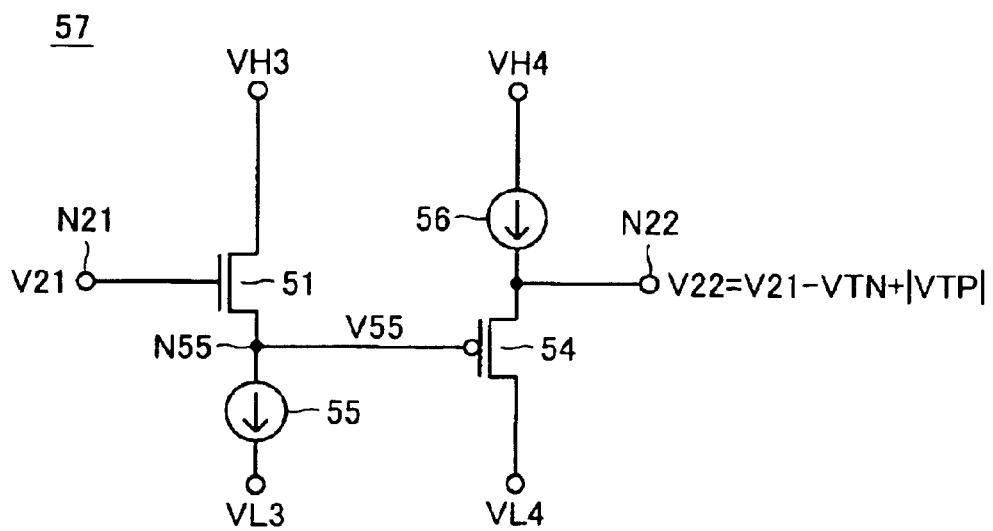
FIG. 13 is a circuit diagram showing a modification of the third embodiment.
Figure 14:
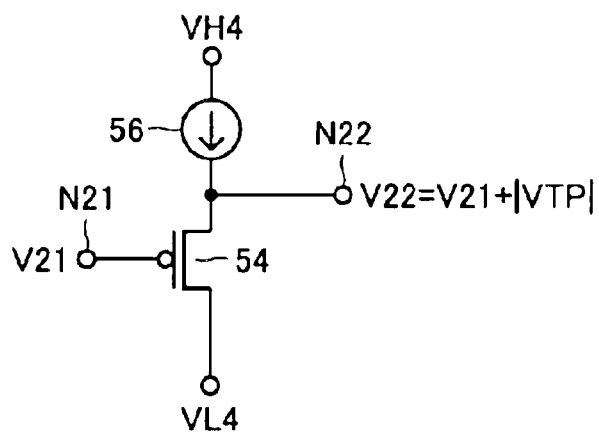
FIG. 14 is a circuit diagram showing another modification of the third embodiment.

A pull-type drive circuit 58 shown in FIG. 14 differs from pull-type drive circuit 57 in FIG. 13 in that the former does not include n-type transistor 51 and constant-current source 55 and that the gate of p-type transistor 54 is connected to input node N21. Output potential V22 is represented by an equation: V22=V21+|VTP|. Drive circuit 58 thus has offset voltage VOF equal to VTN in an initial state. This offset voltage VOF is reduced by the above-described offset cancel operation.

Fourth Embodiment

Figure 15:
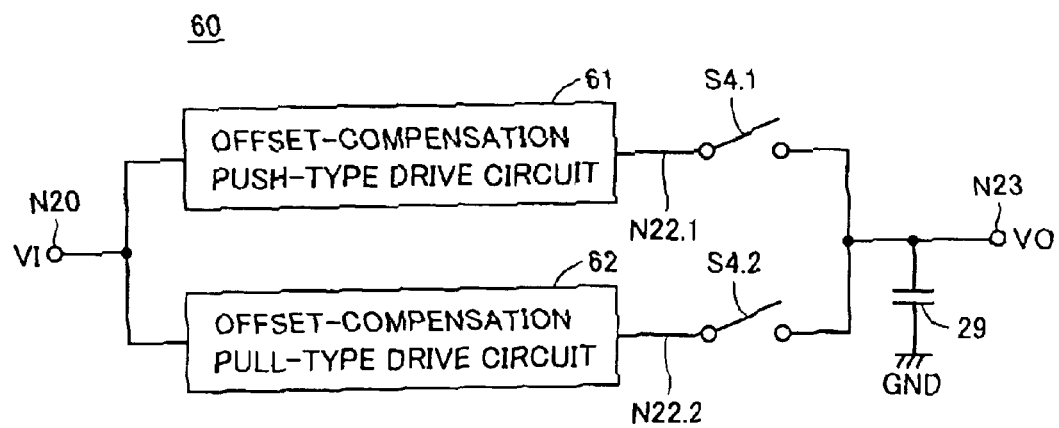
FIG. 15 is a circuit diagram showing a configuration of an offset-compensation drive circuit according to a fourth embodiment of the present invention.

FIG. 15 is a circuit block diagram showing a configuration of an offset-compensation drive circuit 60 according to a fourth embodiment of the present invention. Referring to FIG. 15, offset-compensation drive circuit 60 includes a push-type drive circuit 61 having offset-compensation capability (hereinafter offset-compensation push-type drive circuit) and a pull-type drive circuit 62 having offset-compensation capability (hereinafter offset-compensation pull-type drive circuit) that are connected in parallel and is used in a case where precharge potential VCP described in connection with FIG. 3 is a potential between 0 V and 5 V, for example, 2.5 V.

Offset-compensation push-type drive circuit 61 may be any of the offset-compensation push-type drive circuits described in connection with the first and second embodiments and offset-compensation pull-type drive circuit 62 may be any of the offset-compensation pull-type drive circuits described in connection with the third embodiment. Although switches S4.1 and S4.2 are actually included in drive circuits 61 and 62 respectively, these switches are shown separately from drive circuits 61 and 62 for simplifying description and facilitating understanding.

Data line 6, namely output node N23 is precharged to precharge potential VCP and thereafter gray-level potential VG is supplied to input node N20. Then, the offset cancel operation as described in conjunction with FIG. 7 is done by each of drive circuits 61 and 62. Both of switches S4.1 and S4.2 are turned on so that output node N23 is driven to gray-level potential VG. At this time, since two drive circuits 61 and 62 output the same potential, no through current flows. In this state, if any positive noise is generated on data line 6, pull-type drive circuit 62 operates while push-type drive circuit 61 operates if any negative noise is generated on data line 6 so that the noise generated on data line 6 can be reduced to a lower level with a low output impedance.

According to the fourth embodiment, precharge potential VCP is set to a potential between 0 V and 5 V, for example, 2.5 V. Therefore, as compared with the case where precharge potential VCP is set to 0 V or 5 V, the potential on data line 6 can more speedily be set and the power consumption can be reduced.

Fifth Embodiment

Figure 16:
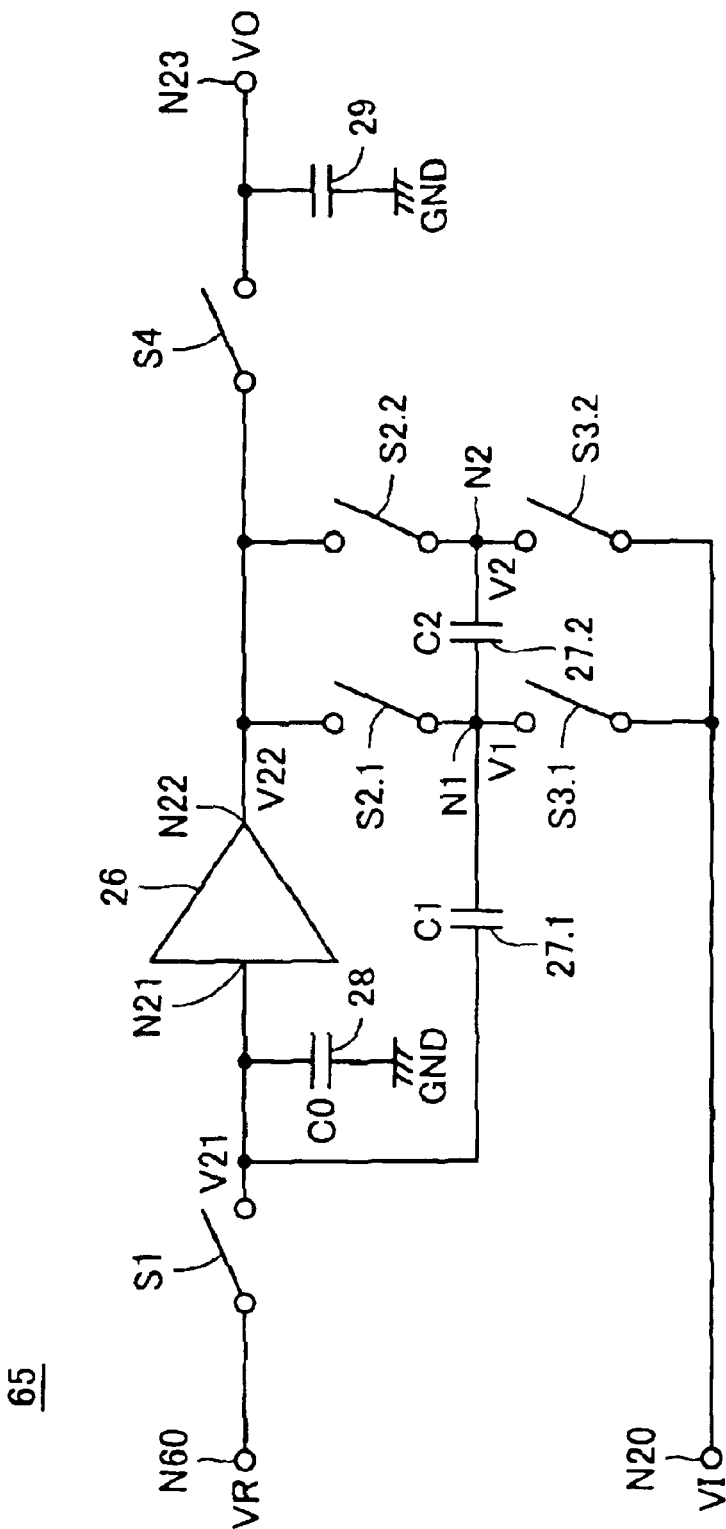
FIG. 16 is a circuit diagram showing a configuration of an offset-compensation drive circuit according to a fifth embodiment of the present invention.

FIG. 16 is a circuit block diagram showing a configuration of an offset-compensation drive circuit 65 according to a fifth embodiment. Referring to FIG. 16, offset-compensation drive circuit 65 differs from offset-compensation drive circuit 25 shown in FIG. 5 in that the former has one terminal of switch S1 connected to a node N60 of a reference potential VR (2.5 V for example) instead of input node N20. Reference potential VR may be supplied directly from the outside of the liquid-crystal display device or supplied from a power-supply circuit of a low output impedance provided within the liquid-crystal display device. Input node N20 is connected to one electrode of switches S3.1 and S3.2 each. Switches S1, S2.1, S2.2, S3.1, S3.2 and S4 are controlled in the same manner as that described in connection with the first embodiment.

A description is given below of an effect of this offset-compensation drive circuit 65 in terms of the first offset-cancel operation performed with capacitor 27.1 and switches S1, S2.1 and S3.1. In this description, it is supposed that output potential V22 of drive circuit 26 is lower than input potential V21 by offset voltage VOF.

Switches S1 and S2.1 are turned on so that input potential V21 of drive circuit 26 becomes equal to reference potential VR, output potential V22 of drive circuit 26 and potential V1 on node N1 each become equal to V21−VOF and thus equal to VR−VOF, and capacitor 27.1 is charged to offset voltage VOF.

Then, switches S1 and S2.1 are turned off so that offset voltage VOF is held in capacitor 27.1. Following this, switch S3.1 is turned on so that potential V1 on node N1 changes from VR−VOF to VI. This amount of change is transmitted via capacitor 27.1 to input node N21 of drive circuit 26. Supposing that there is a relation VI>VR−VOF, an amount of change ΔV in voltage of input node N21 of drive circuit 26 is represented by the following equation:

$$\Delta V = [VI-(VR-VOF)] \circ C1/(C0+C1) \quad (5)$$

where $C1/(C0+C1)=1/(1+C0/C1)$ and, assuming that $C0<<C1$, $1/(1+C0/C1) \approx 1-C0/C1$ is obtained. Further, assuming that $C0/C1=r$, an equation $1-C0/C1=1-r$ is established. This equation is then substituted into equation (5) to reach an equation:

$$\Delta V = [VI-(VR-VOF)] \circ (1-r) \quad (6).$$

Input potential V21 of drive circuit 26 is obtained by adding ΔV to reference potential VR, namely potential VR+ΔV, which is represented by the following equation:

$$\begin{aligned}
V21 &= VR + \Delta V = VR + [VI - (VR - VOF)] \circ (1-r) \quad (7)\\
&= VR + VI - VR + VOF - [VI - (VR - VOF)] \circ r\\
&= VI + VOF - r \circ VOF - r \circ (VI - VR).
\end{aligned}$$

For offset-compensation drive circuit 25 in FIG. 5, a similar calculation is done as follows.

$$\begin{aligned}
V21 &= VI + VOF - VOF \circ C0/(C0+C1)\\
&= VI + VOF - VOF \circ (C0/C1)/(C0/C1+1)\\
&= VI + VOF - VOF \circ r/(1+r)\\
&\approx VI + VOF - VOF \circ r \circ (1-r)\\
&= VI + VOF - VOF \circ (r - r^2).
\end{aligned}$$

Here, assuming that there is a relation $r^2 \approx 0$, the following equation is obtained:

$$V21 \approx VI + VOF - r \circ VOF \quad (8).$$

It is seen from a comparison between equations (7) and (8) that V21 of offset-compensation drive circuit 65 in FIG. 16 is smaller than V21 of offset-compensation drive circuit 25 in FIG. 5 by the forth element $[-r \circ (VI-VR)]$ in equation (7) while this value can be made negligible by reducing r and performing the offset cancel operation multiple times.

If the same gray-level potential VG is supplied from gray-level potential generation circuit 20 shown in FIG. 4 to many offset-compensation drive circuits 25, the load capacitance value of gray-level potential generation circuit 20 is equal to the sum of respective input capacitance values C0 of many drive circuits 26. Accordingly, a longer time is required for stabilizing gray-level potential VG.

By replacing offset-compensation drive circuit 25 with offset-compensation drive circuit 65 in FIG. 16, the input capacitor of drive circuit 26 is charged with reference potential VR. Accordingly, the load capacitance value of gray-level potential generation circuit 20 is remarkably reduced so that gray-level potential VG becomes stable in a short period of time.

Figure 17:
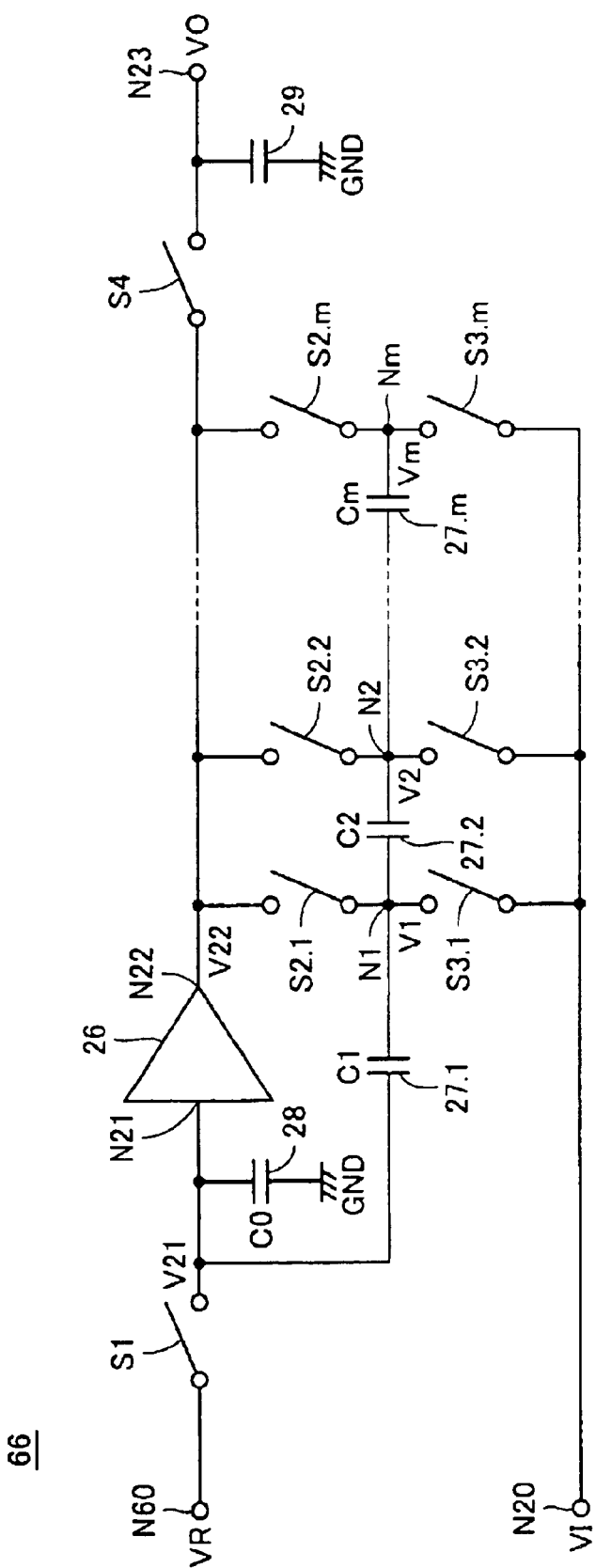
FIG. 17 is a circuit diagram showing a modification of the fifth embodiment.

FIG. 17 is a circuit diagram showing a modification of this embodiment. Referring to FIG. 17, an offset-compensation drive circuit 66 differs from offset-compensation drive circuit 38 in FIG. 8 in that the former has one terminal of switch S1 connected to node N60 of reference potential VR instead of input node N20. With this modification as well, the same effect as that of offset-compensation drive circuit 65 in FIG. 16 is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An offset compensation circuit compensating for an offset voltage of a drive circuit outputting a potential according to an input potential, comprising:

first to N-th capacitors where N is an integer of at least two, said capacitors each having one electrode and the other electrode, the first capacitor having one electrode connected to an input node of said drive circuit, and second to N-th capacitors each having one electrode connected to the other electrode of a preceding capacitor;

a first switch circuit supplying a predetermined potential to the input node of said drive circuit and connecting the other electrode of said first capacitor to an output node of said drive circuit to charge said first capacitor to said offset voltage;

a second switch circuit successively selecting said second to N-th capacitors each for a predetermined period of time, supplying said input potential to one electrode of a selected capacitor and connecting the other electrode of the selected capacitor to the output node of said drive circuit to charge said first to N-th capacitors to said offset voltage; and a third switch circuit supplying said input potential to the other electrode of said N-th capacitor.

2. The offset compensation circuit according to claim 1, wherein said predetermined potential is said input potential.

3. The offset compensation circuit according to claim 1, wherein said predetermined potential is a reference potential.

4. The offset compensation circuit according to claim 1, wherein said second switch circuit connects respective other electrodes of said first to N-th capacitors commonly to the output node of said drive circuit to reset a voltage between one electrode and the other electrode of said second to N-th capacitors each to 0 V, and thereafter successively selects said second to N-th capacitors each for a predetermined period of time to disconnect one electrode of a selected capacitor from the output node of said drive circuit and supply said input potential to one electrode of the selected capacitor, thereby charging said first to N-th capacitors to said offset voltage.

5. A drive circuit with offset-compensation capability, comprising:

a drive circuit outputting a potential according to an input potential; and an offset compensation circuit recited in claim 1 compensating for an offset voltage of said drive circuit.

6. The drive circuit with offset-compensation capability according to claim 5, wherein said drive circuit includes a first transistor of a first conductivity type having its drain receiving a first power-supply potential, its source connected to said output node and its gate connected to said input node, and a first constant-current source connected between said output node and a line of a second power-supply potential.

7. The drive circuit with offset-compensation capability according to claim 6, wherein said drive circuit further includes a level shift circuit provided between said input node and the gate of said first transistor and supplying to the gate of said first transistor a potential obtained by level-shifting said input potential toward said first power-supply potential by a predetermined first voltage, and said level shift circuit includes a second constant-current source connected between a line of a third power-supply potential and the gate of said first transistor and a second transistor of a second conductivity type having its source connected to the gate of said first transistor, its drain connected to a line of a fourth power-supply potential and its gate receiving said input potential.

8. The drive circuit with offset-compensation capability according to claim 7, wherein said drive circuit further includes a third transistor of the second conductivity type inserted between the source of said first transistor and said output node and having its gate connected to said output node, and said level shift circuit further includes a fourth transistor of the first conductivity type inserted between the gate of said first transistor and the source of said second transistor and having its gate connected to the gate of said first transistor.

9. The drive circuit with offset-compensation capability according to claim 5, wherein said drive circuit includes a transistor connected between a line of a first power-supply potential and said output node, a constant-current source connected between said output node and a line of a second power-supply potential, and a differential amplifier circuit controlling a gate potential of said transistor to allow a potential on said output node to be equal to said input potential.

10. A liquid-crystal display device comprising:

a drive circuit with offset-compensation capability recited in claim 5; and a liquid-crystal cell having a light-transmission factor changing according to an output potential of said drive circuit with offset-compensation capability.

* * * * *